US008885430B2

(12) United States Patent
Sato et al.

(10) Patent No.: US 8,885,430 B2
(45) Date of Patent: Nov. 11, 2014

(54) SEMICONDUCTOR MEMORY DEVICE AND DATA PROCESSING SYSTEM

(75) Inventors: Homare Sato, Tokyo (JP); Junichi Hayashi, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 1001 days.

(21) Appl. No.: 12/923,790

(22) Filed: Oct. 7, 2010

(65) Prior Publication Data

US 2011/0087835 A1    Apr. 14, 2011

(30) Foreign Application Priority Data

Oct. 9, 2009  (JP) .................................. 2009-235480

(51) Int. Cl.
| | |
|---|---|
| G11C 7/00 | (2006.01) |
| G06F 12/00 | (2006.01) |
| G11C 11/4072 | (2006.01) |
| G11C 11/406 | (2006.01) |
| G11C 16/20 | (2006.01) |
| G11C 11/4076 | (2006.01) |

(52) U.S. Cl.
CPC .......... *G11C 11/4072* (2013.01); *G11C 11/406* (2013.01); *G11C 16/20* (2013.01); *G11C 11/40618* (2013.01); *G11C 2211/4061* (2013.01); *G11C 11/4076* (2013.01)
USPC .................... 365/222; 711/106; 711/E12.001

(58) Field of Classification Search
USPC ......................................... 365/222; 711/106
See application file for complete search history.

(56) References Cited

U.S. PATENT DOCUMENTS

| | | | | |
|---|---|---|---|---|
| 6,226,709 | B1 * | 5/2001 | Goodwin et al. | ............. 711/106 |
| 6,349,068 | B2 * | 2/2002 | Takemae et al. | ............. 365/222 |
| 7,466,577 | B2 * | 12/2008 | Sekiguchi et al. | ............. 365/51 |
| 2007/0126105 | A1 | 6/2007 | Yamada et al. | |
| 2009/0039915 | A1 * | 2/2009 | Ruckerbauer et al. | ........... 326/38 |
| 2009/0268539 | A1 * | 10/2009 | Ruckerbauer et al. | ........ 365/222 |

FOREIGN PATENT DOCUMENTS

| | | |
|---|---|---|
| JP | 2000-030439 | 1/2000 |
| JP | 2000-215661 A | 8/2000 |
| JP | 2005-158158 A | 6/2005 |
| JP | 2007-157266 | 6/2007 |

* cited by examiner

*Primary Examiner* — Hoai V Ho
*Assistant Examiner* — Tri Hoang
(74) *Attorney, Agent, or Firm* — McGinn IP Law Group, PLLC

(57) ABSTRACT

To include a plurality of core chips to which different pieces of chip information from each other are given in advance. A first refresh command is divided into a plurality of second refresh commands having different timings from each other, and a refresh operation is performed on a core chip for which a count value of the second refresh commands and at least a portion of the chip information match each other. With this configuration, even when the second refresh command is commonly supplied to a plurality of core chips, it is possible to shift a timing for the refresh operation in each of the core chips. Therefore, it is possible to reduce a peak current at the time of the refresh operation.

20 Claims, 15 Drawing Sheets

| CORE CHIP | LID2 | LID1 | LID0 | NUMBER OF GENERATION OF INTERNAL REFRESH COMMAND REFb | | | |
|---|---|---|---|---|---|---|---|
| | | | | FIRST TIME | SECOND TIME | THIRD TIME | FOURTH TIME |
| CC0 | 0 | 0 | 0 | O | | | |
| CC1 | 0 | 0 | 1 | | O | | |
| CC2 | 0 | 1 | 0 | | | O | |
| CC3 | 0 | 1 | 1 | | | | O |
| CC4 | 1 | 0 | 0 | O | | | |
| CC5 | 1 | 0 | 1 | | O | | |
| CC6 | 1 | 1 | 0 | | | O | |
| CC7 | 1 | 1 | 1 | | | | O |

O ··· REFRESH OPERATION

FIG.9

SEMICONDUCTOR MEMORY DEVICE AND DATA PROCESSING SYSTEM

BACKGROUND OF THE INVENTION

1. Field of the Invention

The present invention relates to a semiconductor memory device and a data processing system, and more particularly relates to a semiconductor memory device that needs a refresh operation to maintain data stored therein and a data processing system including the semiconductor memory device.

2. Description of Related Art

A memory cell of a DRAM (Dynamic Random Access Memory), which is one of the representative semiconductor memory devices, has excellent characteristics of having a small occupation area per memory cell and achieving a high degree of integration, because it is configured with one transistor and one capacitor. On the other hand, because data written in the memory cell is lost with a lapse of a predetermined time, it is necessary to perform a refresh operation in a periodic manner to maintain the data.

In the refresh operation, a relatively large current flows because it is required to simultaneously activate a plurality of sense amplifiers. Taking this point into consideration, Japanese Patent Application Laid-open No. 2000-30439 proposes a method for controlling a peak current by shifting a timing for performing the refresh operation for each bank, when a refresh command is issued from outside. This method can be easily implemented by providing a transfer path of a refresh signal for each bank in a separate manner in a chip.

Meanwhile, in recent years, there has been proposed a method for configuring a semiconductor memory device, in which a front end part and a back end part of a DRAM are respectively integrated in separate chips and the chips are laminated (see Japanese Patent Application Laid-open No. 2007-157266). According to this method, because an occupation area where a memory core can be assigned is increased in a plurality of core chips in which the back end portions are respectively integrated, it is possible to increase a memory capacity per chip (per core chip). Besides, because the front end parts are integrated, and an interface chip that is common to a plurality of core chips can be manufactured by a process different from that for the memory core, it is possible to form a circuit with a high speed transistor. Furthermore, because a plurality of core chips can be assigned to one interface chip, it is possible to provide a high capacity and high speed semiconductor memory device as a whole.

In this type of semiconductor memory device, from a viewpoint of cost reduction, it is very important to manufacture core chips with the same mask.

However, when core chips are manufactured with the same mask, each of the core chips will have the same circuit configuration, which results in a situation that it is difficult for an interface chip to send a signal to a specific core chip in a selective manner. Therefore, in this type of semiconductor memory device, it is difficult to perform a refresh operation in a selective manner by providing a plurality of transfer paths for a refresh signal as in the semiconductor memory device described in Japanese Patent Application Laid-open No. 2000-30439.

SUMMARY

In one embodiment, there is provided a semiconductor device comprising: a plurality of core chips assigned different chip identification information from each other; a refresh control circuit that receives a first refresh command and generates a plurality of second refresh commands having different phases from each other in response to the first refresh command; and a first counter circuit that counts the second refresh commands and generates a count value, wherein each of the core chips performs a refresh operation when the count value matches at least a portion of the chip identification information assigned thereto.

According to the present invention, because a refresh operation is performed by referring to chip information, even when a refresh command is commonly supplied to a plurality of core chips, it is possible to shift a timing for the refresh operation in each of the core chips. Therefore, it is possible to reduce a peak current at a time of the refresh operation.

BRIEF DESCRIPTION OF THE DRAWINGS

The above features and advantages of the present invention will be more apparent from the following description of certain preferred embodiments taken in conjunction with the accompanying drawings, in which:

FIG. 9 is a table showing a relation between the number of generations of the internal refresh command REFb and corresponding one of the core chips CC0 to CC7;

DETAILED DESCRIPTION OF THE EMBODIMENTS

Preferred embodiments of the present invention will be explained below in detail with reference to the accompanying drawings.

Figure 1:
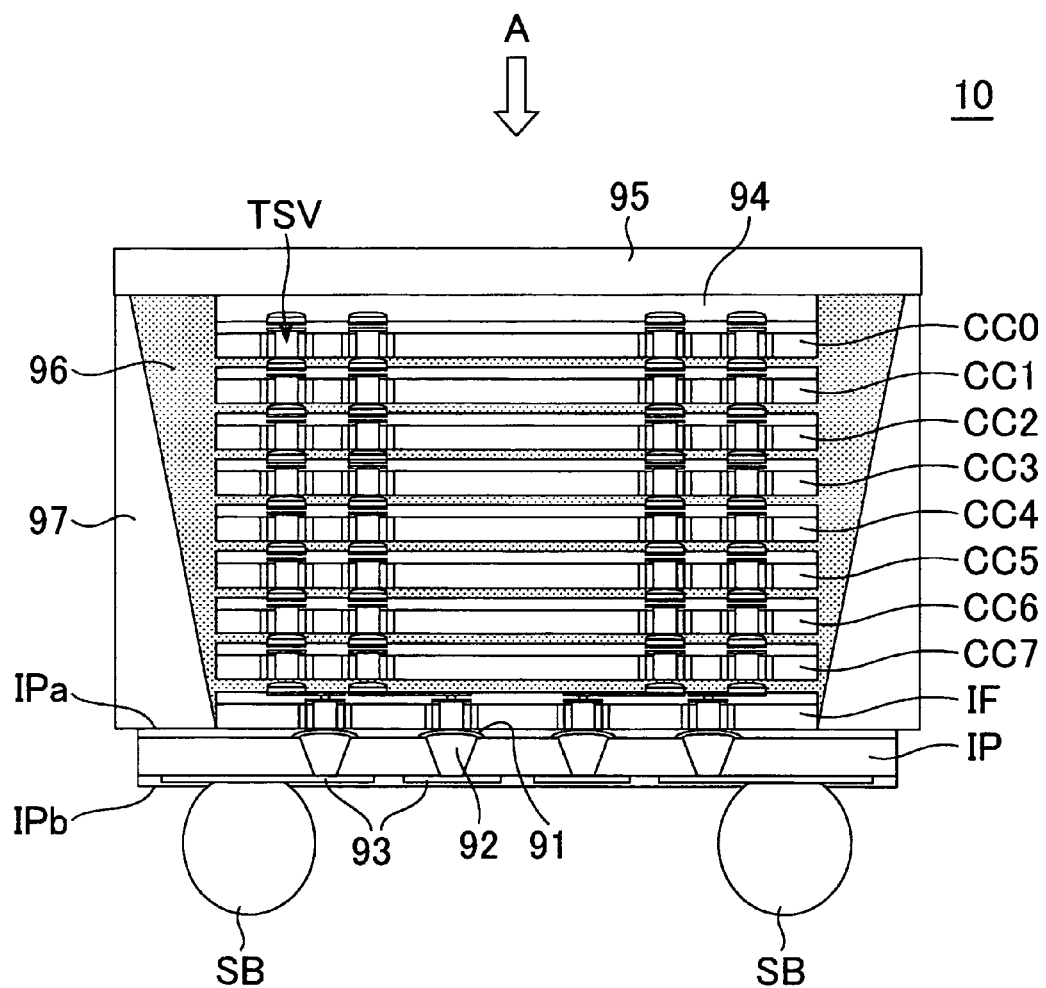
FIG. 1 is a schematic cross-sectional view for explaining the structure of a semiconductor memory device 10 according to the preferred embodiment of the present invention.

FIG. 1 is a schematic cross-sectional view provided to explain the structure of a semiconductor memory device 10 according to the preferred embodiment of the present invention.

As shown in FIG. 1, the semiconductor memory device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural through silicon vias TSV penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor memory device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF maybe disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor memory device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figure 2A:
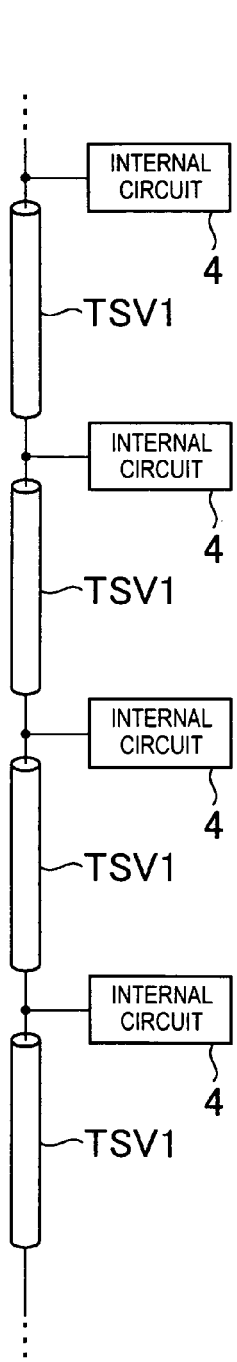
FIGS. 2A to 2C are diagram for explaining the various types of through silicon via TSV provided in a core chip.

When most of the through silicon vias TSV provided in the core chips CC0 to CC7 are two-dimensionally viewed from a lamination direction, that is, viewed from an arrow A shown in FIG. 1, the through silicon vias TSV are short-circuited from the through silicon vias TSV of other layers provided at the same position. That is, as shown in FIG. 2A, the vertically disposed through silicon vias TSV1 that are provided at the same position in plain view are short-circuited, and one wiring line is configured by the through silicon via TSV1. The through silicon vias TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the through silicon via TSV1 are wired-ORed and input to the interface chip IF.

Figure 2B:
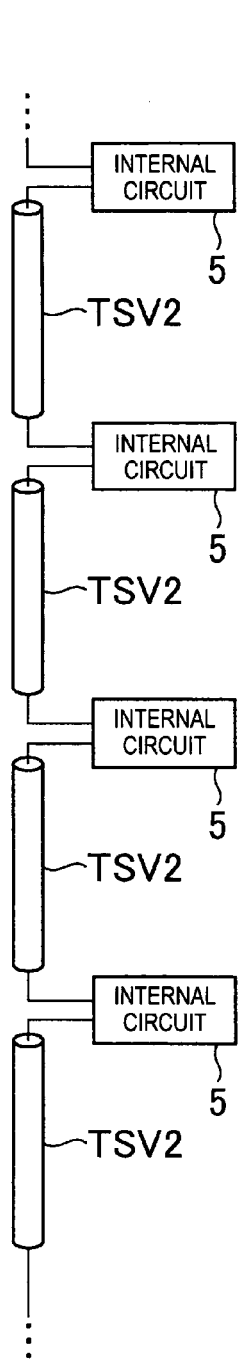

Meanwhile, as shown in FIG. 2B, the a part of through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. As this information, layer address information to be described below is exemplified.

Figure 2C:
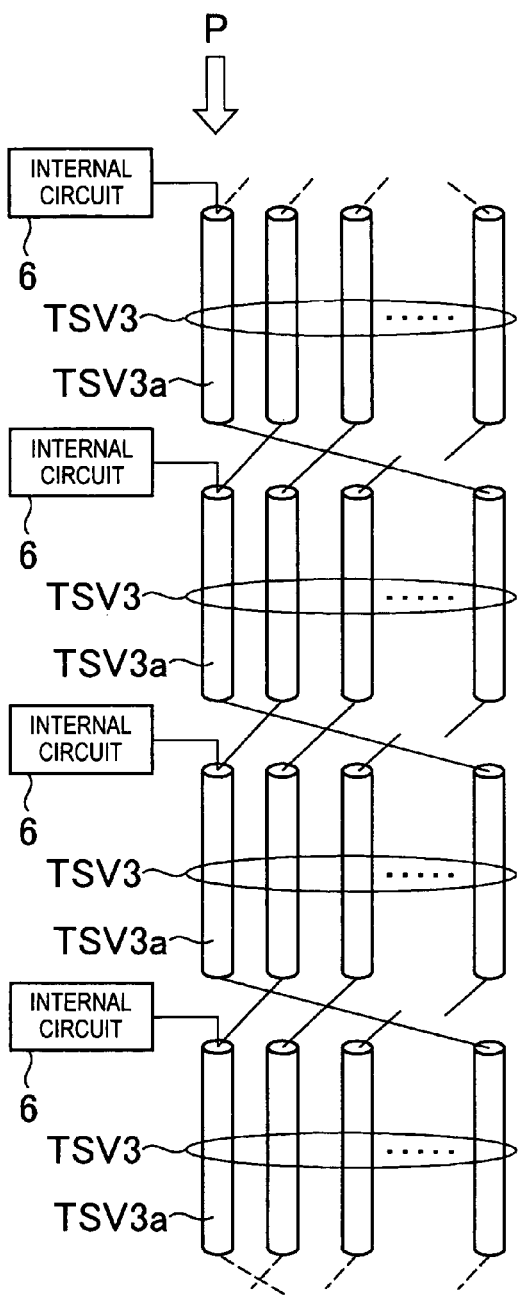

Another group of through silicon vias TSV is short-circuited from the through silicon vias TSV of other layer provided at the different position in plan view, as shown in FIG. 2C. With respect to this kind of group of through silicon vias TSV3, internal circuits 6 of the core chips CC0 to CC7 are connected to the through silicon via TSV3a provided at the predetermined position P in plain view. Thereby, information can be selectively input to the internal circuits 6 provided in the core chips. As this information, defective chip information to be described below is exemplified.

As such, as types of the through silicon vias TSV provided in the core chips CC0 to CC7, three types (TSV1 to TSV3) shown in FIGS. 2A to 2C exist. As described above, most of the through silicon vias TSV are of a type shown in FIG. 2A, and an address signal, a command signal, and a clock signal are supplied from the interface chip IF to the core chips CC0 to CC7, through the through silicon via TSV1 of the type shown in FIG. 2A. Read data and write data are input to and output from the interface chip IF through the through silicon via TSV1 of the type shown in FIG. 2A. Meanwhile, the through silicon vias TSV2 and TSV3 of the types shown in FIGS. 2B and 2C are used to provide individual information to the core chips CC0 to CC7 having the same structure.

Figure 3:
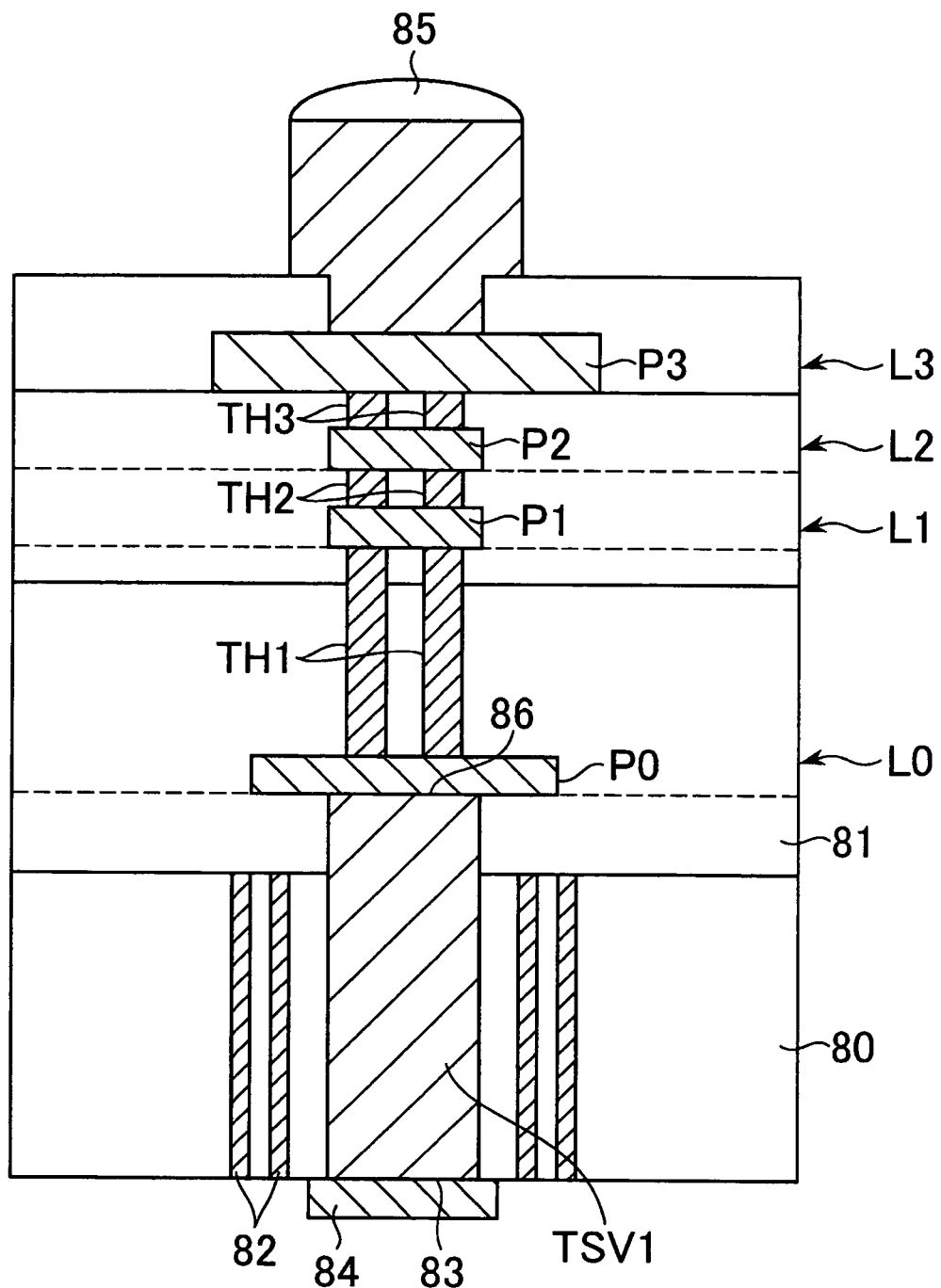
FIG. 3 is a cross-sectional view showing the structure of the through silicon via TSV1 of the type shown in FIG. 2A.

FIG. 3 is a cross-sectional view illustrating the structure of the through silicon via TSV1 of the type shown in FIG. 2A.

As shown in FIG. 3, the through silicon via TSV1 is provided to penetrate a silicon substrate 80 and an interlayer insulating film 81 provided on a surface of the silicon substrate 80. Around the through silicon via TSV1, an insulating ring 82 is provided. Thereby, the through silicon via TSV1 and a transistor region are insulated from each other. In an example shown in FIG. 3, the insulating ring 82 is provided double. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
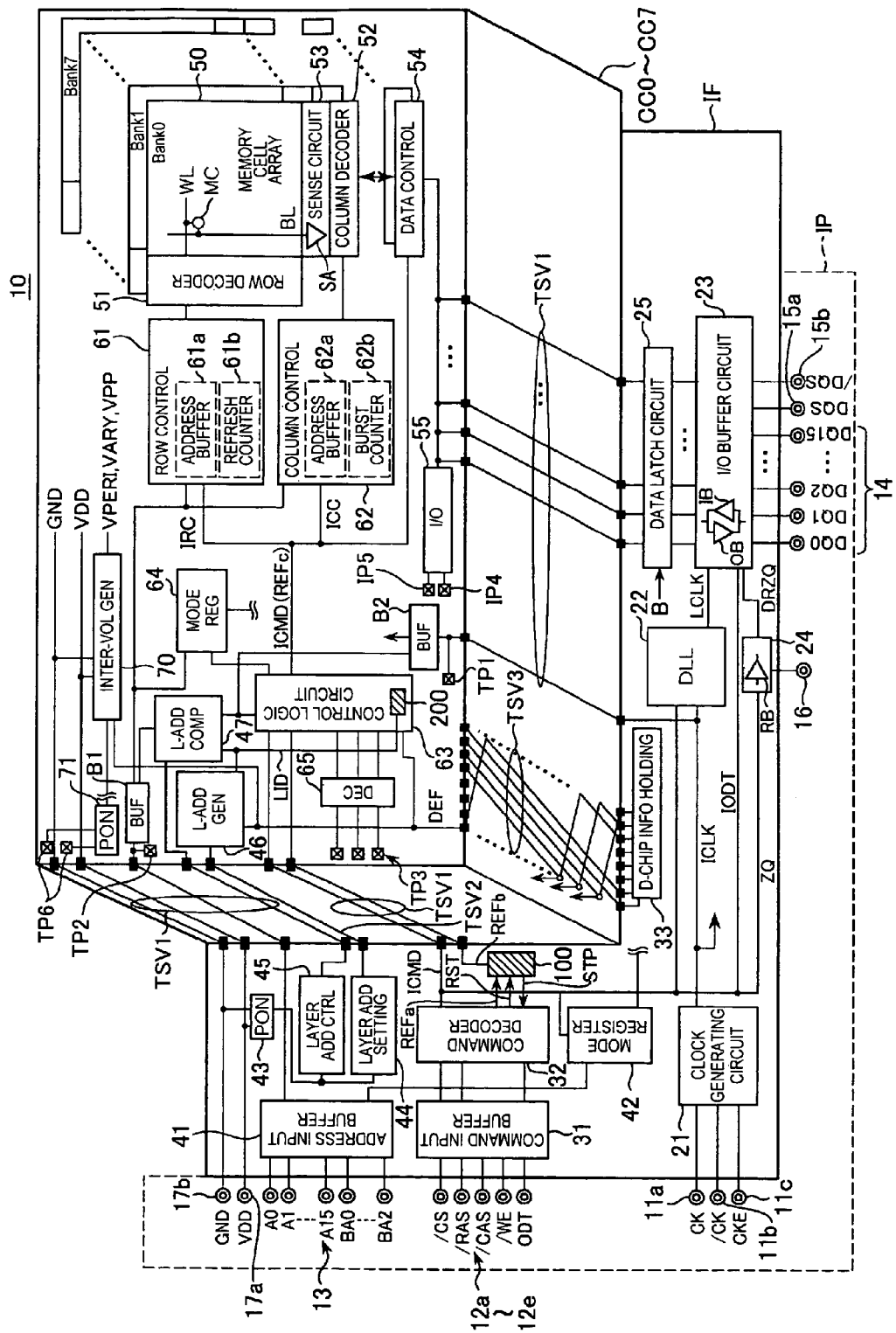
FIG. 4 is a block diagram illustrating the circuit configuration of the semiconductor memory device 10.

FIG. 4 is a block diagram illustrating the circuit configuration of the semiconductor memory device 10.

As shown in FIG. 4, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the through silicon vias TSV.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the through silicon vias TSV.

The interface chip IF further includes a refresh control circuit 100. When a refresh command is input to the command decoder 32, an internal refresh command REFa is supplied from the command decoder 32 to the refresh control circuit 100. Although details thereof are described later, the refresh control circuit 100 takes a function of activating an internal refresh command REFb a plurality of times by dividing the internal refresh command REFa and supplying a plurality of internal refresh commands obtained by dividing the internal refresh command REFa to the core chips CC0 to CC7.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the through silicon vias TSV. The address signals AO to A15 are supplied to a mode register 42 provided in the interface chip IF, when the semiconductor memory device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits □ 8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different through silicon vias TSV, and partial parallel/serial conversion may be performed in the core chips CC0 to CC7 and the number of through silicon vias TSV that are needed for each DQ may be reduced. For example, all of data of 64 bits for each DQ do not need to be input/output using the different through silicon vias TSV, and 2-bit parallel/serial conversion may be performed in the core chips CC0 to CC7 and the number of through silicon vias TSV that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the through silicon vias TSV. The power-on detecting circuit 43 detects the supply of power. On detecting the supply of power, the power-on detecting circuit activates a layer address control circuit 45 on the interface chip IF.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the through silicon vias TSV.

The interface chip IF is also provided with a layer address setting circuit 44. The layer address setting circuit 44 is connected to the core chips CC0 to CC7 through the through silicon vias TSV. The layer address setting circuit 44 is cascade-connected to the layer address generating circuit 46 of the core chips CC0 to CC7 using the through silicon via TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the through silicon vias TSV. The defective chip information holding circuit 33 is connected to the core chips CC0 to CC7 while being shifted, using the through silicon via TSV3 of the type shown in FIG. 2C.

The above description is the outline of the connection relationship between the external terminals and the interface chip IF and the circuit configuration of the interface chip IF. Next, the circuit configuration of the core chips CC0 to CC7 will be described.

As shown in FIG. 4, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor memory device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the external terminals (for example, plural control terminals and plural I/O terminals) of the semiconductor memory device 10 are shared. In the memory cell array 50, the plural word lines WL and the plural bit lines BL intersect each other, and memory cells MC are disposed at intersections thereof (in FIG. 4, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the through silicon via TSV, and the row address that is buffered by the address buffer 61a is supplied to the row decoder 51. The address signal that is supplied through the through silicon via TSV is supplied to the row control circuit 61 through the input buffer B1. The row control circuit 61 also includes a refresh counter 61b. When an internal refresh command REFc is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the through silicon via TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers or the like) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the through silicon via TSV.

The control logic circuit 63 receives an internal command ICMD supplied from the interface chip IF through the through silicon via TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the through silicon via TSV and a layer address LID (chip identification information) set to the layer address generating circuit 46.

The control logic circuit 63 includes a refresh control circuit 200. Although details thereof are described later, the refresh control circuit 200 takes a function of counting the internal refresh command REFb supplied from the interface chip IF, and when a predetermined count value is obtained, activating the internal refresh command REFc. The internal refresh command REFc is supplied to the refresh counter 61b in the row control circuit 61, and a refresh operation is performed on a row address that is indicated by the refresh counter 61b.

In the layer address generating circuit 46, unique layer addresses are set to the core chips CC0 to CC7, respectively, at initialization. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the through silicon vias. TSV of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the through silicon via TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the through silicon via TSV. As the defective chip signal DEF is supplied to the individual core chips CC0 to CC7 using the through silicon via TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI (≈VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the through silicon via TSV. The internal clock signal ICLK supplied through the through silicon via TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal and test data or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 Gb are laminated, the semiconductor memory device 10 has a memory capacity of 8 Gb in total. Because the chip selection signal /CS is input to one terminal (chip selection terminal), the semiconductor memory device is recognized as a single DRAM having the memory capacity of 8 Gb, in view of the controller.

Figure 5:
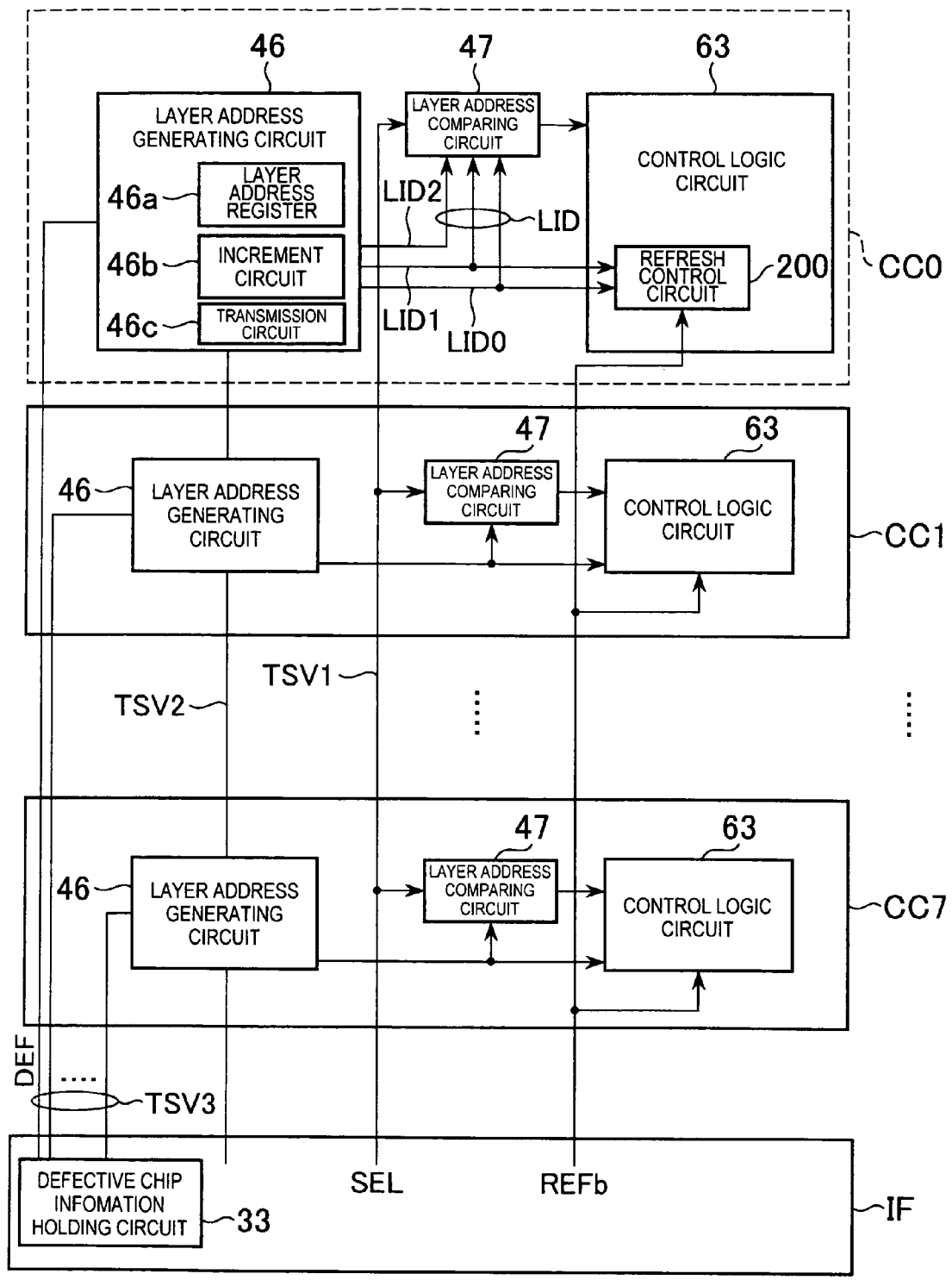
FIG. 5 is a circuit diagram for showing circuits pertaining to a generation of the layer address.

FIG. 5 is a circuit diagram for showing circuits pertaining to a generation of the layer address.

As shown in FIG. 5, the layer address generating circuits 46 are provided in the core chips CC0 to CC7, respectively, and are cascade—connected through the through silicon via TSV2 of the type shown in FIG. 2B. The layer address generating circuit 46 includes a layer address register 46a, an increment circuit 46b, and a transmission circuit 46c.

The layer address register 46a holds a layer address (chip identification information) LID of 3 bits. When the power supply is detected by the power-on detecting circuit 71 shown in FIG. 4, a register value is initialized to a minimum value (0, 0, 0). In the core chip CC0 of the uppermost layer, the increment circuit 46b increments an layer address LID (0, 0, 0) in the layer address register 46a and the incremented value (0, 0, 1) is transmitted to the core chip CC1 of the lower layer by the transmission circuit 46c. A transmitted layer address LID (0, 0, 1) is set to the layer address register 46a of the core chip CC1.

Even in the core chip CC1, a value (0, 1, 0) that is obtained by incrementing the layer address LID (0, 0, 1) in the layer address register 46a by the increment circuit 46b is transmitted to the core chip CC2 of the lower layer by the transmission circuit 46c.

Hereinafter, in the same way as the above case, the incremented layer addresses LID are sequentially transmitted to the core chips of the lower layers. Finally, a maximum value (1, 1, 1) is set to the layer address register 46a of the core chip CC7 of the lowermost layer. Thereby, each of the core chips CC0 to CC7 has a unique layer address LID.

A defective chip signal DEF is supplied from the defective chip information holding circuit 33 of the interface chip IF to the layer address generating circuit 46 through the through silicon via TSV3 of the type shown in FIG. 2C. The defective chip signal DEF is a signal of 8 bits and the bits are supplied to the corresponding core chips CC0 to CC7. The core chip where the corresponding bits of the defective chip signal DEF is activated is the defective chip. In the core chip where the corresponding bits of the defective chip signal DEF is activated, the transmission circuit 46c transmits, to the core chip of the lower layer, a non-incremented layer address LID, not an incremented layer address LID. In other words, the LID allocating of defective chip is skipped. That is, the layer address LID that is allocated to each of the core chips CC0 to CC7 is not fixed and changes according to the defective chip signal DEF. The same layer address LID as the lower layer is allocated to the defective chip. However, since the control logic circuit 63 is prohibited from being activated in the defective chip, a read operation or a write operation is not securely performed, even though an address signal or a command signal is input from the interface chip IF.

The layer address LID set in the above manner is supplied to the layer address comparing circuit 47 in the same one of the core chips CC0 to CC7. The layer address comparing circuit 47 is a circuit that compares the layer address LID supplied from the layer address generating circuit 46 with a portion SEL of the address signal supplied from the interface chip IF via the through silicon via TSV. Because the address signal is supplied to each of the core chips CC0 to CC7 in a common manner via the through silicon via TSV1 of a type shown in FIG. 2A, the core chip for which a match is detected by the layer address comparing circuit 47 becomes only one. When a match is detected by the layer address comparing circuit 47, the control logic circuit 63 is activated, and the internal command ICMD supplied from the interface chip IF is enabled.

Furthermore, lower two bits of the layer address LID, LID0 and LID1, are directly supplied to the refresh control circuit 200 in the control logic circuit 63. With this configuration, when the internal refresh command REFb is issued from the interface chip IF, the refresh control circuit 200 performs an operation of generating the internal refresh command REFc regardless of a result of the match detection operation by the layer address comparing circuit 47.

Figure 6:
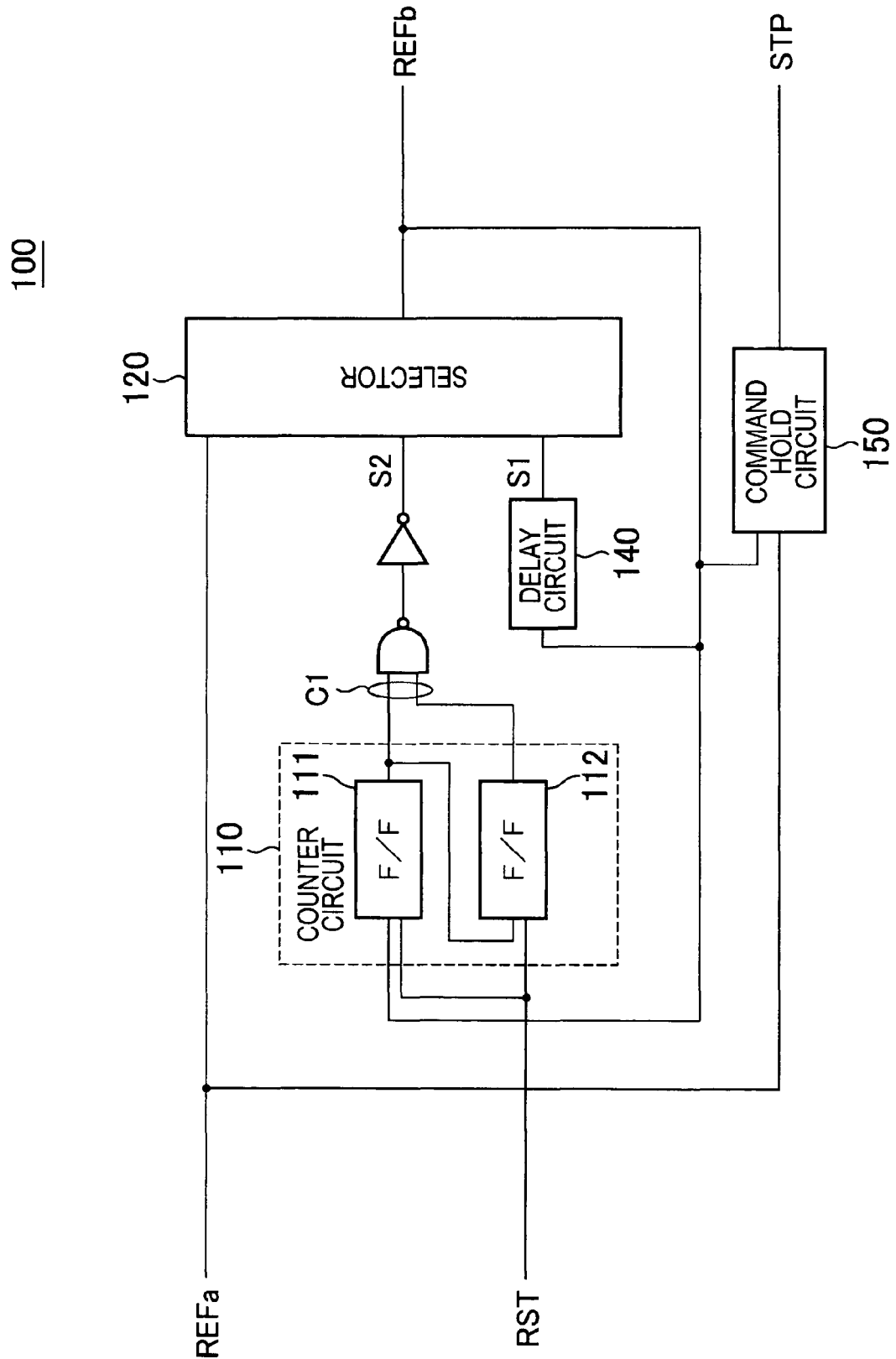
FIG. 6 is a circuit diagram of the refresh control circuit 100.

FIG. 6 is a circuit diagram of the refresh control circuit 100 included in the interface chip IF.

As shown in FIG. 6, the refresh control circuit 100 includes a counter circuit 110 that counts the internal refresh command REFa that is an output of the command decoder 32 and a selector 120 that selects either the internal refresh command REFa or an internal signal S1.

The counter circuit 110 is a 2-bit binary counter that is constituted by two flip flop circuits 111 and 112 connected in a cascaded manner, and performs a counting operation in response to the internal refresh command REFb that is an output of the selector 120. A count value C1 of the counter circuit 110 is initialized to (1, 1) in response to a reset signal RST. Therefore, an internal signal S2 is the high level at an initial condition, and when the counting operation starts, the internal signal S2 becomes the low level, which is maintained until the count value C1 returns to (1, 1).

The internal signal S2 is supplied to the selector 120, and is used as a select signal. Specifically, when the internal signal S2 is the high level, the selector 120 selects and outputs the internal refresh command REFa, and when the internal signal S2 is the low level, the selector 120 selects and outputs the internal signal S1. The output of the selector 120 is used as the internal refresh command REFb, and as shown in FIG. 5, is supplied to the refresh control circuit 200 in each of the core chips CC0 to CC7 in a common manner.

The internal signal S1 is a signal that is obtained by delaying the internal refresh command REFb by a delay circuit 140.

The refresh control circuit 100 further includes a command hold circuit 150. The command hold circuit 150 is a circuit that is set by the internal refresh command REFa and reset by four times of counting the internal refresh command REFb. A command hold signal STP is activated while the command hold circuit 150 is set, by which the operation of the command decoder 32 is suspended.

Figure 7:
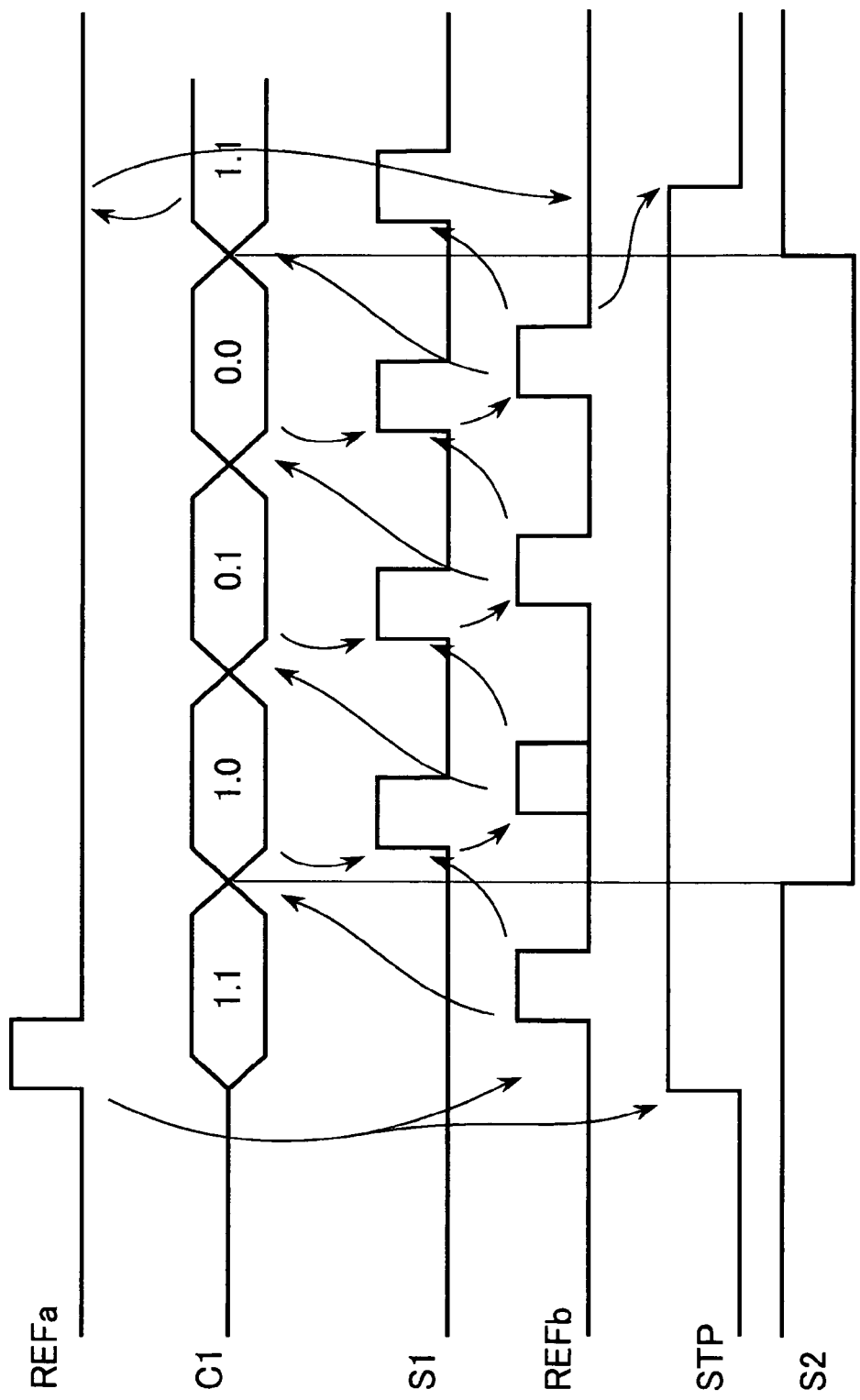
FIG. 7 is a timing chart for explaining an operation of the refresh control circuit 100.

FIG. 7 is a timing chart for explaining an operation of the refresh control circuit 100.

First, when the internal refresh command REFa is activated, it is output as it is as the internal refresh command REFb by a selection of the selector 120, because the count value C1 is (1, 1). The count value C1 is then changed because the internal refresh command REFb is supplied to the counter circuit 110, by which the internal signal S2 is changed to the low level. Thereafter, the internal signal S1, which is the internal refresh command REFb that has passed through the delay circuit 140, is fed back to the selector 120 and output as the next internal refresh command REFb.

In this manner, a plurality of internal refresh commands REFb are generated in succession by being triggered by one internal refresh command REFa. That is, one internal refresh command REFa is divided into a plurality of internal refresh commands REFb having different timings from each other. Subsequently, when the internal refresh command REFb is activated four times, the count value C1 of the counter circuit 110 returns to the initial value (1, 1), by which the generation of the internal refresh command REFb is terminated. The internal refresh command REFb that is activated four times in the above manner is, as described above, supplied to the refresh control circuit 200 in each of the core chips CC0 to CC7 in a common manner.

Figure 8:
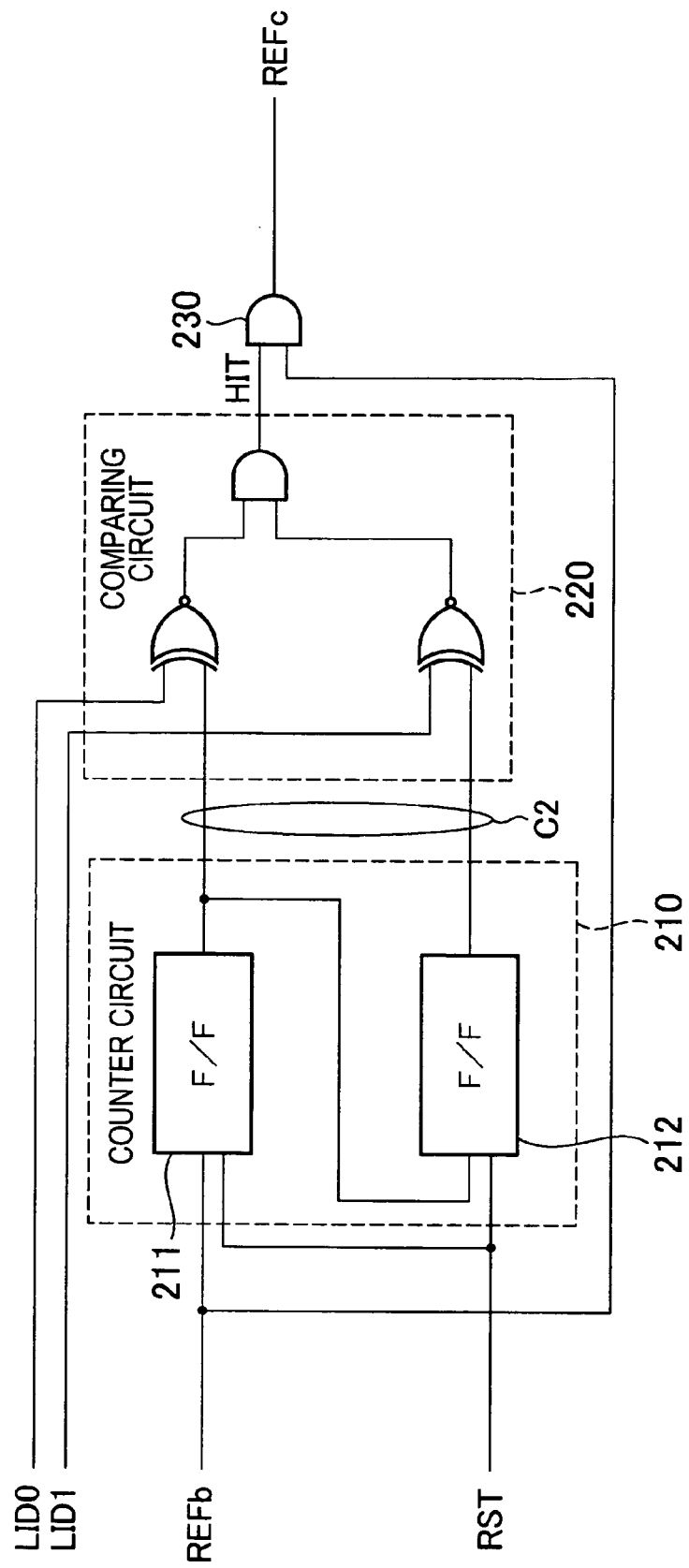
FIG. 8 is a circuit diagram of the refresh control circuit 200.

FIG. 8 is a circuit diagram of the refresh control circuit 200 included in each of the core chips CC0 to CC7.

As shown in FIG. 8, the refresh control circuit 200 includes a counter circuit 210 that counts the internal refresh command REFb that is supplied from the interface chip IF and a comparing circuit 220 that compares a count value C2 of the counter circuit 210 with the lower two bits of the layer address LID (LID0 and LID1).

The counter circuit 210 is a 2-bit binary counter that is composed of two flip flop circuits 211 and 212 connected in a cascaded manner, performing a counting operation in response to the internal refresh command REFb. The count value C2 of the counter circuit 210 is reset to an arbitrary value, for example, C2=(0, 0) in response to the reset signal RST.

The comparing circuit 220 compares each bit of the count value C2 with each of the lower two bits of the layer address LID (LID0 and LID1), and when all the bits match each other, generates a match signal HIT. The match signal HIT and the internal refresh command REFb are supplied to an AND gate circuit 230, and an output of the AND gate circuit 230 is used as the internal refresh command REFc. As described above, the internal refresh command REFc is supplied to the row control circuit 61, and when it is activated, the refresh operation is performed on the row address that is indicated by the refresh counter 61b.

With this configuration, as four internal refresh commands REFb are generated in succession in response to a single internal refresh command REFa, the refresh operation is performed four times (two by two) on the eight core chips CC0 to CC7.

FIG. 9 is a table showing a relation between the number of generations of the internal refresh command REFb and corresponding one of the core chips CC0 to CC7 that performs the refresh operation.

In the present embodiment, because the internal refresh command REFc is generated by comparing the count value C2 of the counter circuit 210 with the lower two bits of the layer address LID (LID0 and LID1), as shown in FIG. 9, the core chips CC0 and CC4 perform the refresh operation in response to the first time of the internal refresh command REFb, the core chips CC1 and CC5 perform the refresh operation in response to the second time of the internal refresh command REFb, the core chips CC2 and CC6 perform the refresh operation in response to the third time of the internal refresh command REFb, and the core chips CC3 and CC7 perform the refresh operation in response to the fourth time of the internal refresh command REFb.

In this manner, in the present embodiment, the refresh operation is performed four times in response to a single internal refresh command REFa. This makes it possible to reduce the peak current, compared to a case that all the core chips CC0 to CC7 perform the refresh operation at the same time. Although the refresh operation is performed four times (two by two) on the eight core chips CC0 to CC7 in the present embodiment, it goes without saying that the present invention is not limited to this arrangement. For example, the refresh operation can be performed on the eight core chips CC0 to CC7 one by one by generating eight internal refresh commands REFb in response to a single internal refresh command REFa. This can be implemented by setting the number of bits of the counter circuits 110 and 210 to three bits and comparing them with all bits of the layer address LID in the comparing circuit 220. Alternatively, the refresh operation can be performed two times on the eight core chips CC0 to CC7 four by four by generating two internal refresh commands REFb in response to a single internal refresh command REFa. This can be implemented by setting the number of bits of the counter circuits 110 and 210 to one bit and comparing it with an arbitrary one bit of the layer address LID in the comparing circuit 220.

Figure 10:
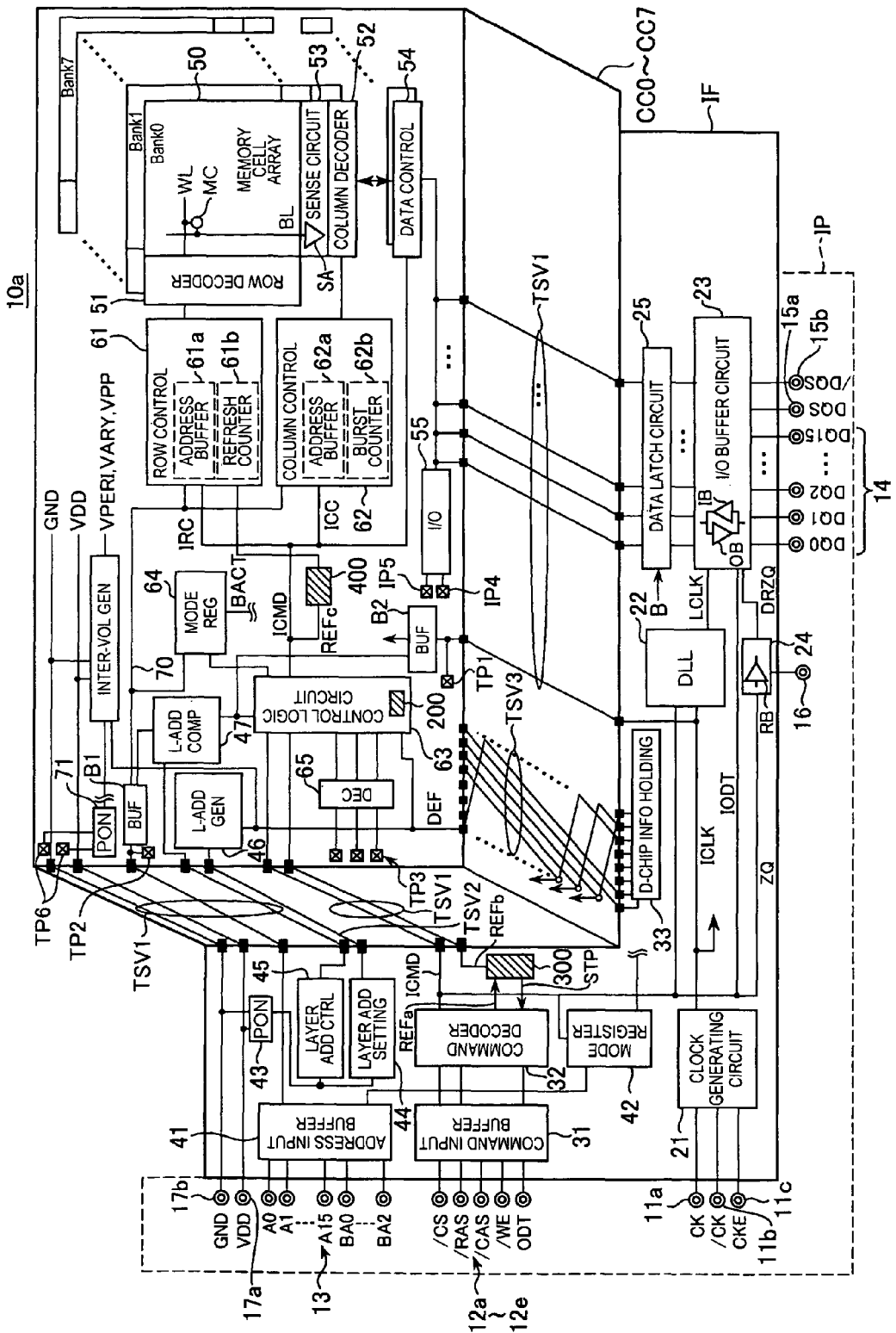
FIG. 10 is a block diagram showing a circuit configuration of a semiconductor memory device 10a according to another embodiment of the present invention.

FIG. 10 is a block diagram showing a circuit configuration of a semiconductor memory device 10a according to another embodiment of the present invention.

As shown in FIG. 10, the semiconductor memory device 10a according to the present embodiment is different from the semiconductor memory device 10 shown in FIG. 4 in that the refresh control circuit 100 on the interface chip IF is replaced by a refresh control circuit 300 and a bank select circuit 400 is added on each of the core chips CC0 to CC7. As for other features, the semiconductor memory device 10a has the same configuration as that of the semiconductor memory device 10, and thus like reference numerals are assigned to like elements and redundant explanations thereof will be omitted.

Figure 11:
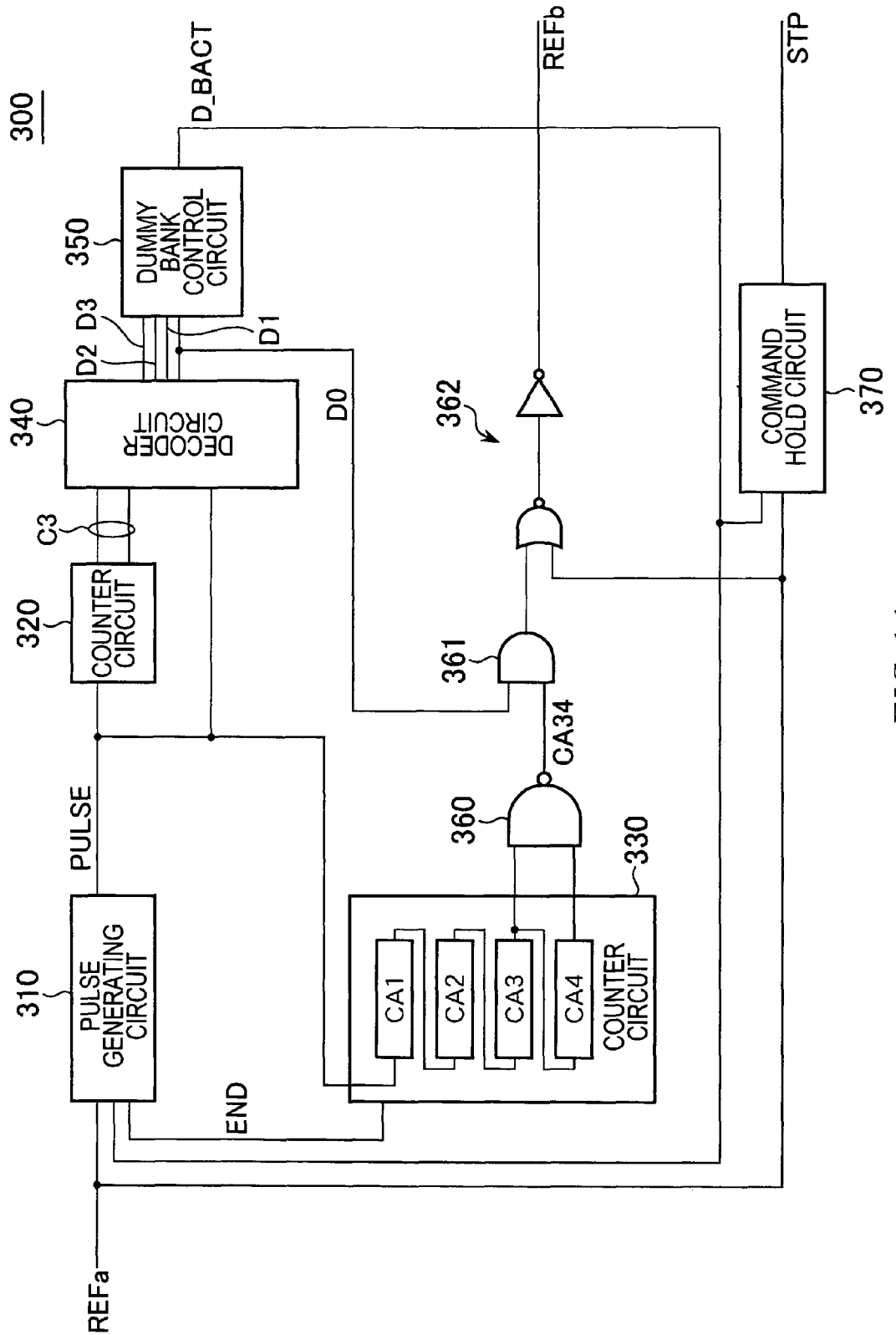
FIG. 11 is a circuit diagram of the refresh control circuit 300.

FIG. 11 is a circuit diagram of the refresh control circuit 300.

As shown in FIG. 11, the refresh control circuit 300 includes a pulse generating circuit 310 that generates an internal pulse PULSE in response to the internal refresh command REFa, counter circuits 320 and 330 that count the internal pulse PULSE, a decoder circuit 340 that decodes a count value C3 of the counter circuit 320, and a dummy bank control circuit 350 that generates a dummy bank active signal D_BACT based on an output of the decoder circuit 340. The dummy bank active signal D_BACT is fed back to the pulse generating circuit 310 to be used as a timing signal for generating the next internal pulse PULSE.

The counter circuit 320 is a 2-bit binary counter. The count value C3 of the counter circuit 320 is input to the decoder circuit 340, by which the decoder circuit 340 activates any one of four output signals D0 to D3 based on the count value C3. Among the output signals D0 to D3, the output signal D0 is supplied to one input terminal of an AND gate circuit 361.

Meanwhile, the counter circuit 330 is a 4-bit binary counter. Upper two bits CA3 and CA4 of a count value of the counter circuit 330 are supplied to a NAND gate circuit 360. An output CA34 of the NAND gate circuit 360 is supplied to other input terminal of the AND gate circuit 361. An output of the AND gate circuit 361 is output as the internal refresh command REFb via an OR gate circuit 362. Upon counting the internal pulse PULSE 16 times, the counter circuit 330 activates an end signal END, by which the generation of the internal pulse PULSE by the pulse generating circuit 310 is suspended.

Figure 12:
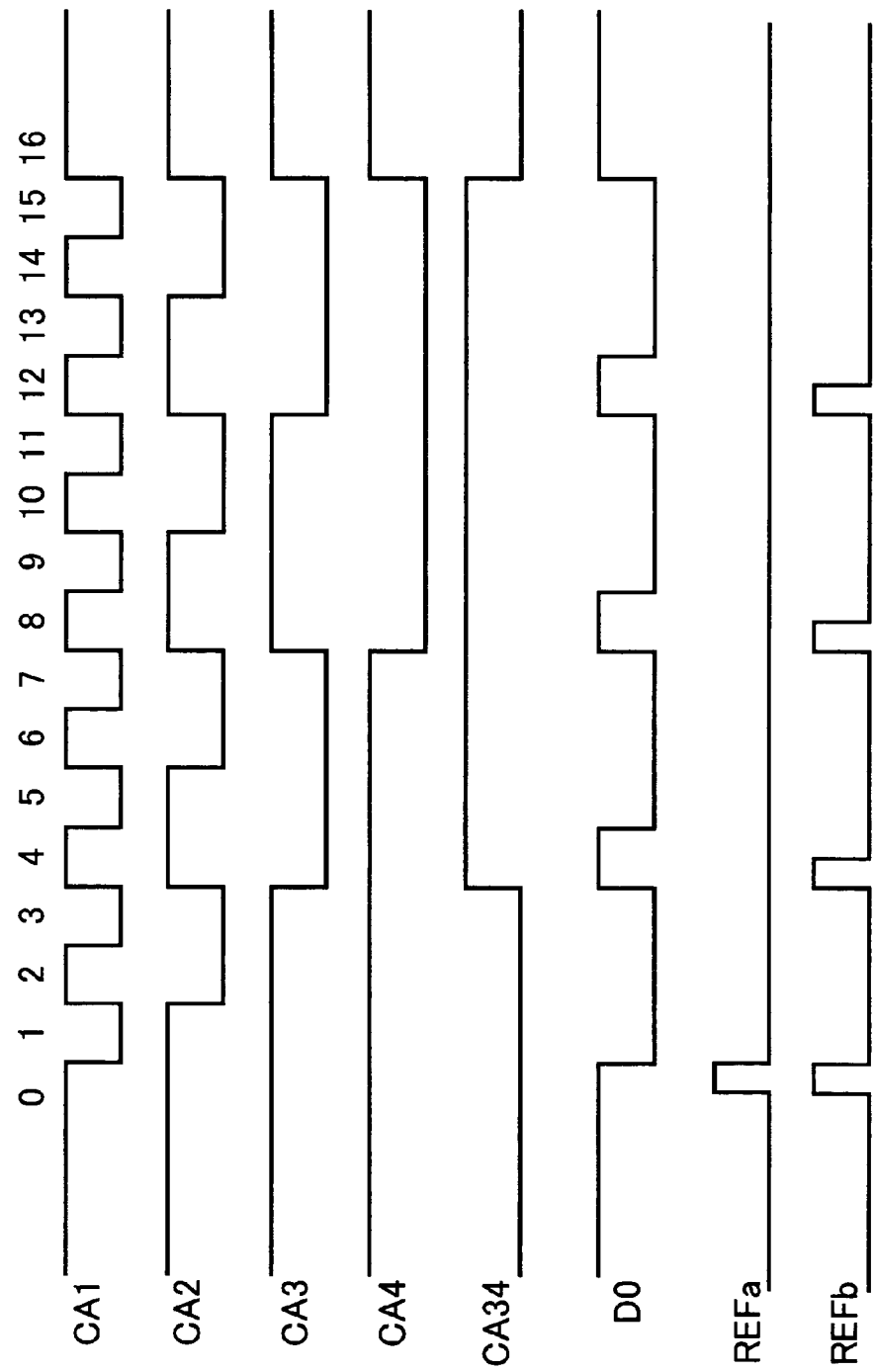
FIG. 12 is a timing chart for explaining an operation of the refresh control circuit 300.

With this configuration, when the count of the counter circuit 330 is progressed in response to the generation of the internal pulse PULSE, as shown in FIG. 12, every time the output signal D0 is activated, the internal refresh command REFb is generated in conjunction with the activation of the output signal D0. Among the internal refresh commands REFb, the first internal refresh command REFb is generated by an input of the internal refresh command REFa as a trigger to the OR gate circuit 362, and the second to fourth internal refresh commands REFb are generated in conjunction with the output signal D0. When the counter circuit 330 counts the internal pulse PULSE 16 times, the output CA34 of the NAND gate circuit 360 is changed to the low level, and as a result, no internal refresh commands REFb are generated for the fifth and later ones.

A command hold circuit 370 included in the refresh control circuit 300 is set by the internal refresh command REFa, and reset by 16 times of counting the dummy bank active signal DBACT. A command hold signal STP is activated while the command hold circuit 370 is set, by which the operation of the command decoder 32 is suspended.

Figure 13:
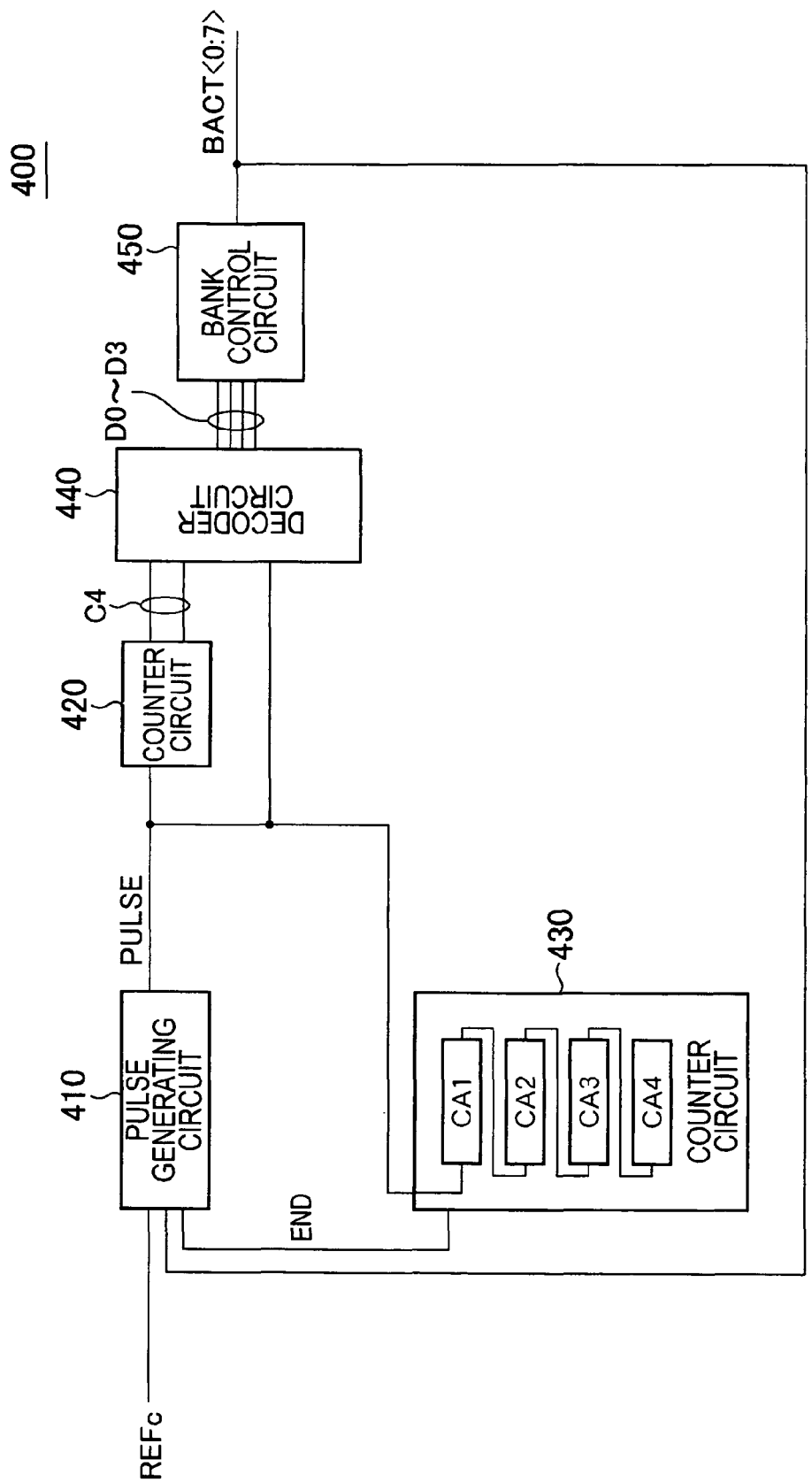
FIG. 13 is a circuit diagram of the bank select circuit 400.

FIG. 13 is a circuit diagram of the bank select circuit 400 included in each of the core chips CC0 to CC7.

As shown in FIG. 13, the bank select circuit 400 has a circuit configuration obtained by removing the gate circuits 360 to 362 and the command hold circuit 370 from the refresh control circuit 300 shown in FIG. 11. A pulse generating circuit 410 included in the bank select circuit 400 generates an internal pulse PULSE in response to the internal refresh command REFc and supplies the internal pulse PULSE to counter circuits 420 and 430.

The counter circuit 420 is a 2-bit binary counter. A count value C4 of the counter circuit 420 is input to a decoder circuit 440, by which the decoder circuit 440 activates any one of four output signals D0 to D3 based on the count value C4. A bank control circuit 450 activates any two of eight bank active signals BACT0 to BACT7 based on the activation of any one of the output signals D0 to D3. Specifically, the bank control circuit 450 activates the bank active signals BACT0 an BACT7 in response to the output signal D0, the bank active signals BACT3 and BACT4 in response to the output signal D1, the bank active signals BACT1 and BACT6 in response to the output signal D2, and the bank active signals BACT2 and BACT5 in response to the output signal D3. The bank active signals BACT0 to BACT7 are fed back to the pulse generating circuit 410, and used as a timing signal for generating the next internal pulse PULSE.

The counter circuit 430 is a 4-bit binary counter. Upon counting the internal pulse PULSE 16 times, the counter circuit 430 activates an end signal END, by which the generation of the internal pulse PULSE by the pulse generating circuit 410 is suspended.

With this configuration, the bank select circuit 400 performs an operation that is synchronized with the refresh control circuit 300 to activate different two of the bank active signals BACT0 to BACT7 every time the internal pulse PULSE is activated.

Figure 14:
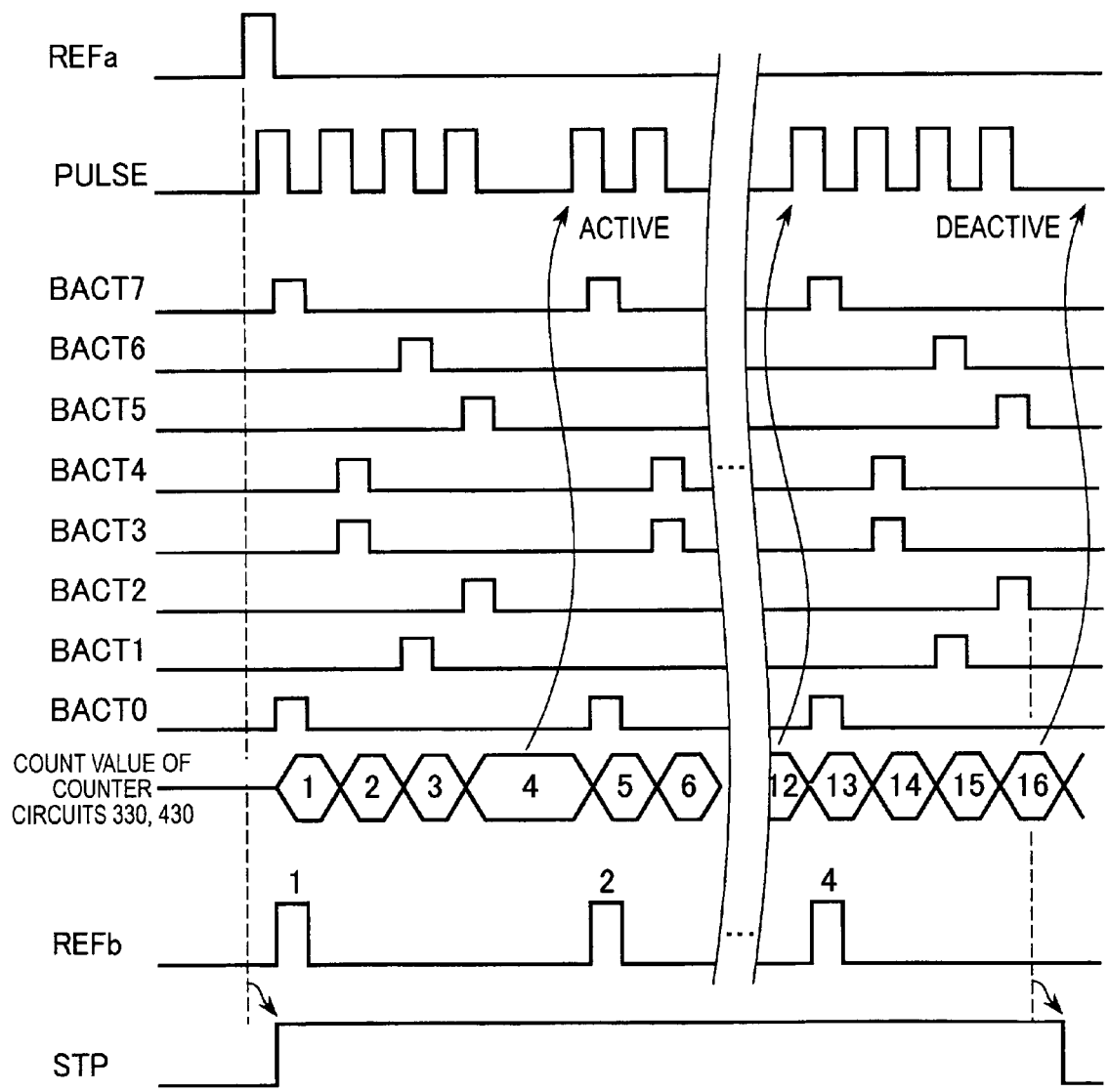
FIG. 14 is a timing chart for explaining an operation of the bank select circuit 400.

FIG. 14 is a timing chart for explaining an operation of the bank select circuit 400.

As shown in FIG. 14, when the internal refresh command REFa is activated, the internal pulse PULSE is activated 16 times in succession. Because the internal refresh command REFb is activated every four times of the internal pulse PULSE, four internal refresh commands REFb are activated in total. As explained earlier, when the internal refresh command REFb is activated, the refresh operation is performed on any two of the core chips CC0 to CC7. At this time, because two different memory banks are selected one after another in conjunction with the internal pulse PULSE that is generated four times in selected core chips, the refresh operation is not performed on all the banks at the same time, but performed four times (two by two) on the eight memory banks.

In this manner, according to the present embodiment, because the execution timing of the refresh operation is shifted between banks in the same core chip as well as between the core chips, it is possible to more reduce the peak current.

Figure 15:
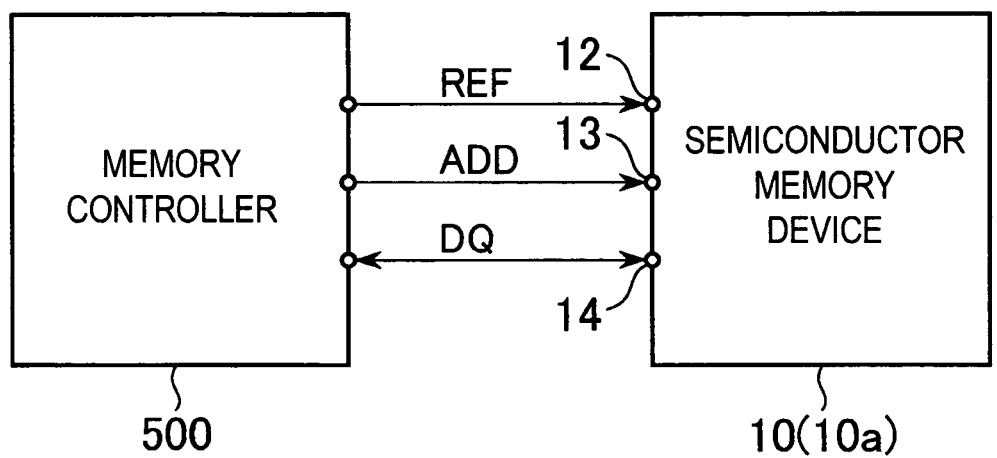
FIG. 15 is a block diagram showing a configuration of a data processing system employing the semiconductor memory device 10.

FIG. 15 is a block diagram showing a configuration of a data processing system employing the semiconductor memory device 10 (or 10a) according to the above embodiment.

The data processing system shown in FIG. 15 is configured with the semiconductor memory device 10 and a memory controller 500 that is connected to the semiconductor memory device 10. The memory controller 500 issues an internal refresh command REF to the semiconductor memory device 10 at a regular interval. When the internal refresh command REF is issued from the memory controller 500, the internal refresh command REFc is activated at timings respectively assigned to the core chips CC0 to CC7 in the semiconductor memory device 10, and therefore the refresh operation is performed in a temporally dispersed manner.

In a normal access, a read command or a write command is input to a command terminal 12, and an address signal ADD is input to an address terminal 13, by which read data DQ is output from a data input/output terminal 14 for a read operation, and write data DQ is input to the data input/output terminal 14 for a write operation.

It is apparent that the present invention is not limited to the above embodiments, but may be modified and changed without departing from the scope and spirit of the invention.

For example, in the above described embodiment, the DDR3-type SDRAM is used as the core chip, but the present invention is not limited thereto. Accordingly, the core chip may be a DRAM other than the DDR3-type and may be a semiconductor memory (SRAM, PRAM, MRAM, flash memory, etc.) other than the DRAM. All of the core chips do not need to be laminated and all or part of the core chips may be two-dimensionally disposed. The number of core chips is not restricted to 8.

Furthermore, although a case that a refresh command is issued from an external memory controller, that is, an operation responding to an auto refresh command is explained as an example in the above embodiments, the same operation can be performed for a self refresh operation. When performing the self refresh operation, because an internal refresh command is activated at a regular interval by an oscillator circuit provided in the interface chip IF, it can be used as the internal refresh command REFa described above.

What is claimed is:

1. A semiconductor device comprising:
   a plurality of core chips assigned different chip identification information from each other;
   a refresh control circuit that receives a first refresh command and generates a plurality of second refresh commands having different phases from each other in response to the first refresh command; and
   a first counter circuit that counts the second refresh commands and generates a count value,
   wherein each of the core chips performs a refresh operation when the count value matches at least a portion of the chip identification information assigned thereto, and
   wherein the refresh operation is shifted in time between at least two of the plurality of core chips.

2. The semiconductor device as claimed in claim 1, further comprising an interface chip coupled to the core chips, wherein the refresh control circuit is included in the interface chip.

3. The semiconductor device as claimed in claim 2, wherein the first counter circuit is included in each of the core chips, and each of the core chips further includes a comparing circuit that compares the count value with at least a portion of the chip identification information assigned thereto.

4. The semiconductor device as claimed in claim 2, wherein each of the core chips includes a plurality of memory banks and a second counter circuit that generates bank information by counting internal pulses, and a refresh operation is performed on one of the memory banks that is indicated by the bank information.

5. The semiconductor device as claimed in claim 2, wherein the second refresh commands are commonly supplied from the interface chip to the core chips via a common wiring.

6. The semiconductor device as claimed in claim 5, wherein the core chips are laminated, and the common wiring includes a through silicon via that is provided on each of the core chips.

7. The semiconductor device as claimed in claim 1, wherein the first refresh command is generated based on an external refresh command that is supplied from outside.

8. The semiconductor device as claimed in claim 2, wherein the first refresh command is automatically generated in the interface chip.

9. A semiconductor device comprising:
   a plurality of core chips each including a plurality of memory cells that requires a refresh operation to maintain data stored therein, where chip identification information is assigned to each of the core chips; and
   an interface chip that commonly supplies a refresh command to the core chips, wherein each of the core chips includes a first counter circuit that counts the refresh command and a comparing circuit that determines whether to perform the refresh operation based on a count value of the first counter circuit and at least a portion of the chip identification information assigned to the core chip,
   wherein the refresh operation is shifted in time between at least two of the plurality of core chips.

10. The semiconductor device as claimed in claim 9, wherein each of the memory cells belongs one of a plurality of memory banks, each of the core chips further includes a second counter circuit that counts internal pulses, and the refresh operation is performed on one of the memory banks that is indicated by a count value of the second counter circuit.

11. The semiconductor device as claimed in claim 9, wherein the core chips are laminated, and the refresh command is commonly supplied to the first counter circuit included in each of the core chips via a through silicon via that is provided on each of the core chips.

12. A semiconductor device mounted on a substrate, comprising:
   an interface chip mounted on the substrate, receiving a refresh command from the substrate, outputting a plurality of first internal refresh signals in sequence in response to the refresh command;
   a first core chip mounted on the interface chip, holding first chip identification information, counting the number of the first internal refresh signals, comparing the first chip identification information with the number of the first internal refresh signals, and generating a second internal refresh signal to perform a refresh operation in the first core chip when the first chip identification information is coincident with the number of the first internal refresh signals; and
   a second core chip mounted on the first core chip, holding second chip identification information which is different from the first chip identification information, counting the number of the first internal refresh signals, comparing the second chip identification information with the number of the first internal refresh signals, and generating a third internal refresh signal to perform a refresh operation in the second core chip when the second chip identification information is coincident with the number of the first internal refresh signals.

13. The semiconductor device as claimed in claim 12, wherein the first identification information includes a number of first bits and the second identification information includes a number of second bits and either the first bits or the second bits is generated by incrementing the other of the first bits and the second bits by one.

14. The semiconductor device as claimed in claim 12, wherein the first core chip includes a first pulse generating circuit which sequentially outputs a plurality of first pulse signals in response to the second internal refresh signal and a plurality of first memory banks each including a plurality of memory cells, and each of the first memory banks being refreshed in response to an associated one of the first pulse signals.

15. The semiconductor device as claimed in claim 14, wherein the second core chip includes a second pulse generating circuit which sequentially outputs a plurality of second pulse signals in response to the third internal refresh signal and a plurality of second memory banks each including a plurality of memory cells, and each of the second memory banks being refreshed in response to an associated one of the second pulse signals.

16. The semiconductor device as claimed in claim 1, when the second refresh command is commonly supplied to each of the plurality of core chips, a shift in timing of the refresh operation is provided among each of the core chips, and
   wherein each of the core chips performs the refresh operation separately when the count value matches at least a portion of the chip identification information assigned thereto.

17. The semiconductor device as claimed in claim 1, wherein the plurality of core chips are divided into at least a first group and a second group, when the second refresh command is commonly supplied to the plurality of core chips, a shift in timing of the refresh operation is provided between at least the first group and the second group of the plurality of core chips.

18. The semiconductor device as claimed in claim 1, wherein the refresh operation is initiated in each of the plurality of core chips when the count value matches at least the portion of the chip identification information assigned thereto, and
  wherein the execution timing of the refresh operation is shifted between banks in the same core and between at least two of the plurality of core chips.

19. The semiconductor device as claimed in claim 1, wherein the plurality of core chips includes a first core chip and a second core chip,
  wherein the first core chip, holding first chip identification information, counts a number of first internal refresh signals, compares the first chip identification information with the number of the first internal refresh signals, and generates a second internal refresh signal to perform a refresh operation in the first core chip when the first chip identification information is coincident with the number of the first internal refresh signals; and
  wherein the second core chip, holding second chip identification information which is different from the first chip identification information, counts the number of the first internal refresh signals, compares the second chip identification information with the number of the first internal refresh signals, and generates a third internal refresh signal to perform a refresh operation in the second core chip when the second chip identification information is coincident with the number of the first internal refresh signals.

20. The semiconductor device as claimed in claim 9, wherein the plurality of core chips includes a first core chip and a second core chip,
  wherein the first core chip, holding first chip identification information, counts a number of first internal refresh signals, compares the first chip identification information with the number of the first internal refresh signals, and generates a second internal refresh signal to perform a refresh operation in the first core chip when the first chip identification information is coincident with the number of the first internal refresh signals; and
  wherein the second core chip, holding second chip identification information which is different from the first chip identification information, counts the number of the first internal refresh signals, compares the second chip identification information with the number of the first internal refresh signals, and generates a third internal refresh signal to perform a refresh operation in the second core chip when the second chip identification information is coincident with the number of the first internal refresh signals.

* * * * *